United States Patent [19]

Brown

[11] Patent Number: 4,809,223

[45] Date of Patent: Feb. 28, 1989

[54] APPARATUS AND METHOD FOR LONG TERM STORAGE OF ANALOG SIGNALS

[75] Inventor: Paul B. Brown, Morgantown, W. Va.

[73] Assignee: West Virginia University, Morgantown, W. Va.

[21] Appl. No.: 64,081

[22] Filed: Jun. 18, 1987

[51] Int. Cl.[4] .............................................. G11C 27/00
[52] U.S. Cl. ...................................... 365/45; 365/222
[58] Field of Search ................. 365/45, 222; 364/571; 307/352, 353, 238.1, 238.3; 377/64, 68

[56] References Cited

U.S. PATENT DOCUMENTS

| | | | |
|---|---|---|---|
| 3,950,733 | 4/1976 | Cooper et al. | 364/900 |
| 4,573,142 | 2/1986 | Azegami | 365/45 |
| 4,593,370 | 6/1986 | Balkanli | 364/571 |

OTHER PUBLICATIONS

Digital Integrated Electronics, Herbert Taub and Donald Schilling, McGraw-Hill, Inc. Copyright 1977, pp. 420-428.

Electronics for the Modern Scientist, Paul B. Brown, Gunter N. Franz, Howard Moraff, Elsevier Science Publishing Co., Inc., Copyright 1982, pp. 421-425.

Primary Examiner—Joseph A. Popek
Attorney, Agent, or Firm—Richard V. Westerhoff

[57] ABSTRACT

A state analog memory device for storing approximations of analog signals for prolonged periods of time converts the analog signal in an n-ary digitizer to the one of a plurality of a discrete levels which is the next greater in magnitude than the applied signal. This digitized signal is then serially stored in an analog storage element comprising connected master and slave sample and hold circuits by a two stage control signal. Periodically, at intervals shorter in duration than the time in which the stored signals would droop to the next lower n level, the stored signal is refreshed by feeding the signal stored in the slave sample and hold circuit back to the digitizer which boosts it back up to the one level which is reentered in the master/slave sample and hold circuits. A state analog dynamic RAM utilizes an array of the analog store elements and a plurality of n-ary digitizers for simultaneously refreshing rows of the storage elements at a time. In addition a shift register utilizing a number of series connected state analog memory devices is disclosed.

22 Claims, 6 Drawing Sheets

APPARATUS AND METHOD FOR LONG TERM STORAGE OF ANALOG SIGNALS

RELATED APPLICATIONS

My concurrently filed United States patent application Ser. No. 07/064,097 entitled "State Analog Neural Net and Method of Implementing Same".

BACKGROUND OF THE INVENTION

1. Field of the Invention

This invention relates to apparatus and a method for storing analog signals for prolonged periods of time. More particularly, it relates to a method and apparatus for long-term storage of an approximation of an analog signal which is periodically refreshed to maintain its value within a prescribed window. Thousands of the devices with which the invention is implemented can be provided on a single semiconductor chip.

2. Background Information

Storage of a variable analog signal in computing circuits is often implemented by sample and hold circuits which store an instantaneous value of the analog signal as a voltage on a capacitor. However, such devices by themselves are not useful for long-term storage because the voltage droops as a result of leakage of the charge stored in the capacitor.

Longer term storage of analog signals can be achieved by converting the analog signal to a digital signal which can be stored indefinitely, and then converting the stored digital signal back to an analog signal when it is needed. However, such a scheme requires analog to digital and digital to analog convertors, and considerable real estate to implement. This becomes a significant problem when a large number of analog signals must be stored for a prolonged period. In addition, the analog to digital and reverse conversions require a considerable amount of time which could be significant in some applications.

Of course, analog signals can be stored indefinitely on magnetic media; however, access time is unacceptably high for massive computations where the stored values are continually changing and/or re-used frequently.

One application where prolonged storage of analog signals is required is in what we call a "state-analog" system in analogy to a state logic system. The digital computer utilizes state logic. State logic is discrete time, discrete-voltage logic which in its purest form has the following constraint: all signals which are inputs for computation are acquired by computing elements at specific times, determined by a clock. The time of acquisition is a time when all the signals are known to be the final values obtained in the previous compute cycle, and before the initiation of the next compute cycle. This generally means that the outputs of computing elements are captured at clock transitions, and held stable so that the computing elements can perform their next computations on stable values. This is necessary because there often exist feedback or feedforward paths which otherwise would cause inputs to a computing element to change while it is performing its computation. In parallel computing applications, such as for example neural nets, it is quite common for the outputs of computing elements to influence each other, and some method of "freezing" results of one computation step is needed so that the next computation step can be performed on a stable input value. In many instances, it is necessary to use a two-phase clocking system with the equivalent of master-slave flipflops used to capture signals. Captured signal values are said to go through successive "states" on successive clock cycles, as do all signal values: hence the name "state logic".

In what we call "state analog" devices, the computing elements are continuous-voltage (analog) devices, but a clocking scheme is used to capture results of computations, and such a device is therefore a state machine. The sample and hold circuit could be considered a state analog device in that the signal to be stored is sampled by a clock pulse, except that, as mentioned above such devices are not suitable for long-term storage of analog signals.

There remains therefore a need for a method and apparatus for long-term storage of variable analog signals.

Accordingly, it is a primary object of this invention to provide an improved method and apparatus for prolonged storage of analog signals.

It is another important object of the invention to provide a state-analog method and apparatus for prolonged storage of analog signals.

It is an additional object of the invention to provide the method and apparatus of the previous objects which can realize high density storage of analog signals, and which can operate reliably at high clock frequencies.

SUMMARY OF THE INVENTION

These and other objects are realized by the invention in which the analog signal to be stored is converted to an n-ary signal, that is a signal having n discrete levels, where n is at least 3, and preferably much greater, using a tracking n-ary digitizer. The n-ary signal, which assumes the next discrete level greater in magnitude than the value of the analog signal, is stored in an analog storage device, which is preferably a master-slave sample and hold circuit. To compensate for voltage droop on the analog storage device, the stored analog approximation signal is periodically refreshed by applying the stored signal to the n-ary digitizer which boosts it back up to the next greater n-ary level. The repetition rate for refreshing the storage signal is selected such that the stored signal never falls below the next n-ary below the level of the input analog signal. Thus, while the stored analog signal droops, it remains within the "window" defined by the n-ary levels bracketing the applied analog signal. Sufficient n levels are made available to provide the desired resolution for the stored analog approximation of the applied signal. If it is known that an analog signal to be stored will remain within a given range, the n-ary levels can be confined to that range to provide improved resolution.

In accordance with one aspect of the invention, the n-ary signal to which the applied analog signal is converted can be modified for certain applications. For instance, the n-ary digitizer can be modified to increment, and/or decrement, the stored signal during the refresh cycle.

The analog storage device of the invention has application as a discrete component and can be used to implement other state-analog devices such a dynamic RAM and a shift register for analog signals.

The invention encompasses both the method and the apparatus for realizing the above functions.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
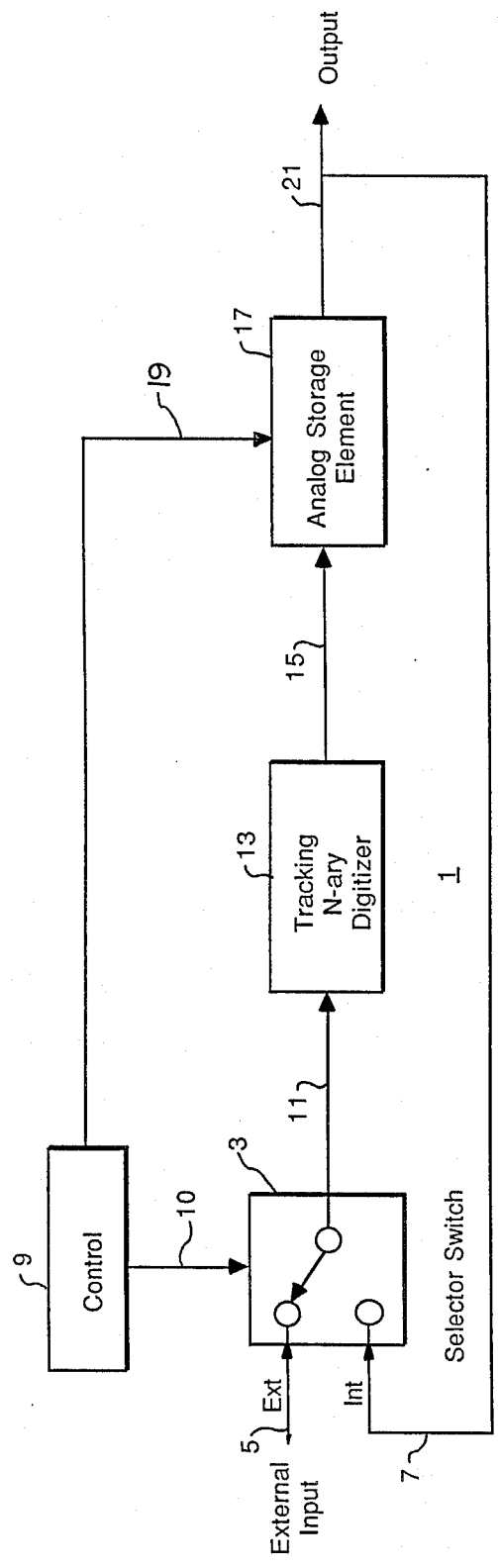
FIG. 1 is a block diagram of an n-ary analog memory device in accordance with the invention.

FIG. 1 illustrates the overall organization of a memory device for long-term storage of an approximation of an analog signal in accordance with the invention. The state analog memory device 1 includes a selector switch 3 which switches between an external input on an external lead 5 and an internal input on a lead 7. The position of switch 3 is controlled by an EXTERNAL/INTERNAL SELECT signal generated by a control unit 9 on a control lead 10.

The external input applied to the lead 5 is the analog signal to be stored, while the signal on the lead 7 is an analog feedback signal. The input signal selected by the selector switch 3 is applied through lead 11 to a tracking n-ary digitizer 13. The digitizer 13 converts the selected analog input signal to an n-ary signal. That is, it converts the analog signal which can have any one of a continuum of values over a given range to one of n discrete values which approximates the actual value of the analog signal. The one value is the n-ary value next greater in magnitude than the actual value of the analog signal. This discretized signal is applied over lead 15 to an analog storage element 17. The analog storage element 17, samples and stores the n-ary analog approximation signal in response to a sample signal generated on a control lead 19 by control unit 9. The stored n-ary analog approximation signal is available as a continuous voltage on the output lead 21.

The stored n-ary analog approximation signal is also fed back to the selector switch by the lead 7. If an external input has not been applied to the memory for a prescribed period of time, and/or periodically at intervals to be described, the selector switch 3 changes state to connect the lead 7 to the tracking n-ary digitizer 13 to refresh the signal stored in the analog storage element 17. This is done because the storage element 17 tends to leak over time causing the stored voltage to droop. The tracking n-ary digitizer 13 converts the stored analog approximation signal to one of the n discrete levels. A sample pulse generated on the control lead 19 by control unit 9 enters this digitized signal into the storage element 17.

The interval at which the signal stored in the analog storage element 17 is fed back through the tracking n-ary digitizer 13 and re-entered in storage element 17 is shorter than the time required for the stored signal to decay to the next smaller in magnitude of the n levels generated by the n-ary digitizer 13. Thus, when the stored signal is fed back to the n-ary digitizer and is raised thereby to the next greater in magnitude of the n levels generated by the digitizer, the stored signal is restored to the original level entered into the storage element 17 when the analog signal was sampled. It can be seen then that the analog approximation signal is periodically refreshed and remains within a window defined by the n levels of the digitizer 13 which bracket the original analog signal. In this manner, an approximation of the analog signal may be stored indefinitely, yet is continuously available for readout.

Figure 2:
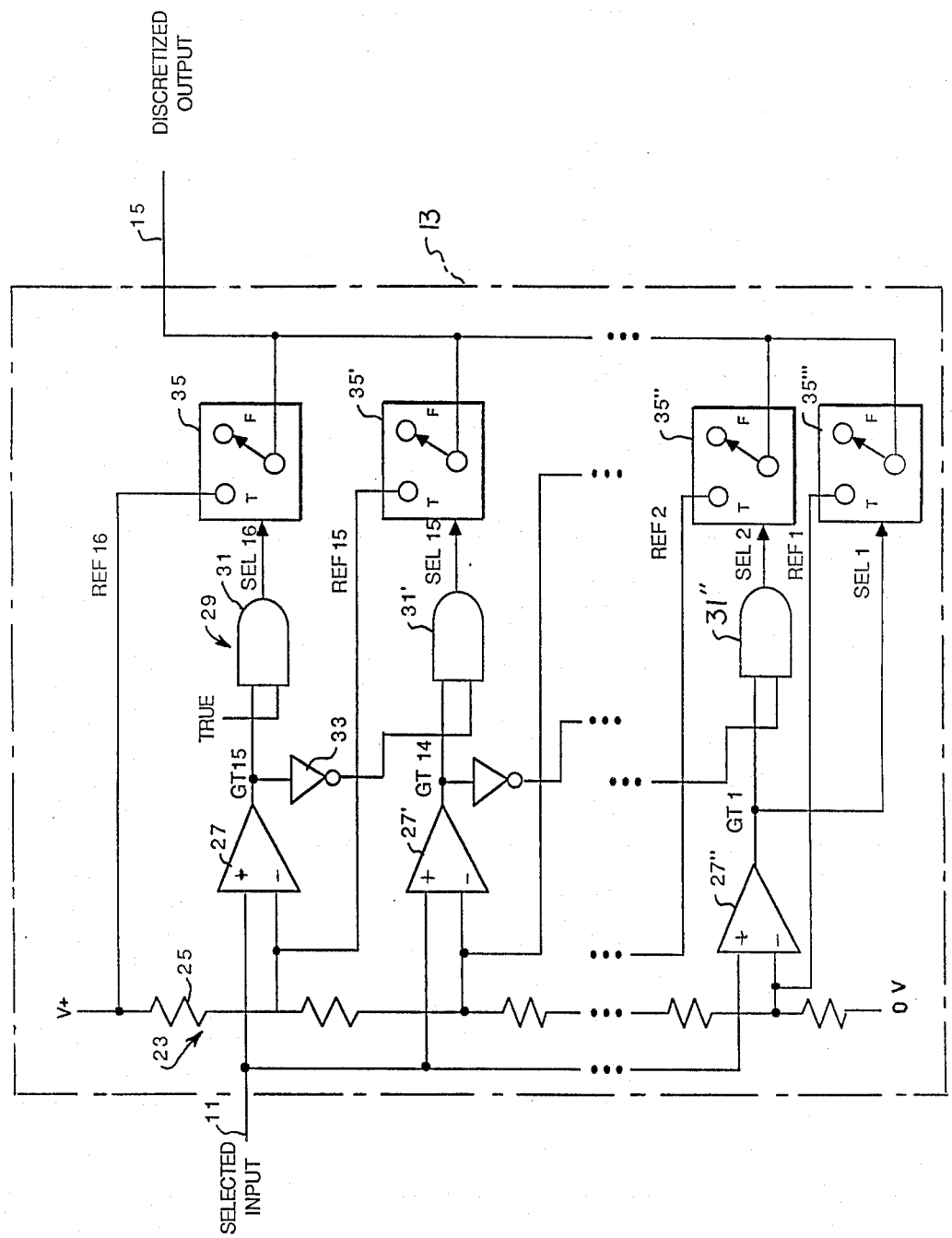
FIG. 2 is a schematic diagram of a tracking n-ary digitizer which forms a part of the n-ary analog memory device of FIG. 1.

FIG. 2 illustrates an exemplary embodiment of the tracking n-ary digitizer 13. The digitizer 13 includes a resistive voltage divider 23 comprising a series of resistors 25 fed by a stable source voltage, $+V$. This voltage divider generates reference voltages for the n discrete levels of the n-ary signal generated by the digitizer 13. In the example, sixteen reference voltages REF 1 to REF 16 are generated.

A series of threshold devices (discriminators) 27 compare the selected input on a lead 11 to each of the reference voltages generated by the voltage divider 23. Logic circuitry 29 selects the discriminator 27 associated with the reference voltage of greatest magnitude which is exceeded in magnitude by the analog voltage on the lead 11. This logic circuitry 29 includes an AND gate 31 associated with each discriminator to which is applied the output of the associated discriminator 27 and the output of the discriminator 27 associated with the reference voltage of next greatest magnitude inverted by an inverter 33.

The AND gates 31 each control a switch 35. The switches 35 are normally open, but when closed they connect the reference voltage of next greater magnitude to the output lead 15. The logic circuitry 29 is such that only the switch 35 associated with the reference voltage of greatest magnitude which is exceeded by the applied voltage will be turned on, and that switch will apply the reference voltage of next greatest magnitude to the lead 15.

Operation of the digitizer 13 of FIG. 2 may be more clearly understood by the following example. Assume that the analog voltage on the lead 11 is higher (more positive) than the reference voltage applied to the discriminator 27', but below the reference voltage applied to the discriminator 27. Thus, the output, GT14, of discriminator 27' will be high while the output, GT15, of discriminator 27 will be low. However, the low output of discriminator 27 will be inverted by the invertor 33 so that both of the inputs to the AND 31' will be high and the output, SEL15., will be high to turn on switch 35'. With the switch 35' turned on, the reference voltage, REF 15, applied to the discriminator 27 will be connected to the lead 15. All of the other switches 35 will be turned off: switch 35 because the output of discriminator 27 is low; and all of the other switches below switch 35' because, while the output of the associated discriminator will be high, the output of the next higher discriminator is also high and will be inverted to apply a low input to the associated AND gate 31. It can be seen then, that the analog signal on lead 11 is boosted to the next higher of the n-ary levels generated by the n-ary digitizer 13.

Figure 3:
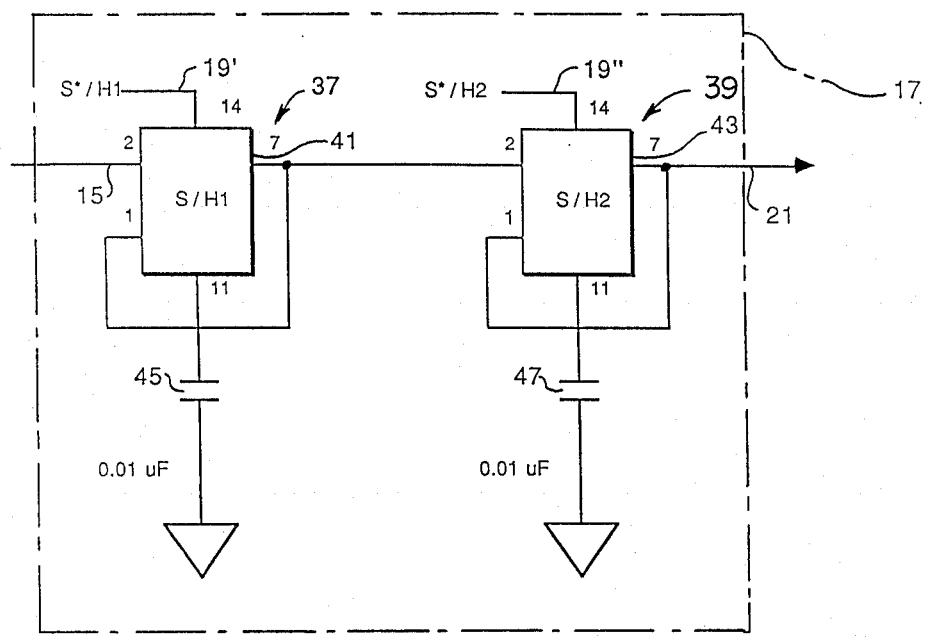
FIG. 3 is a schematic diagram of an analog storage device which forms a part of the n-ary analog memory device of FIG. 1.

For simplicity, only positive voltages are used in the exemplary memory device 1, so that the stored signal always droops in one direction. In another words, ground is always lower than the stored voltage. Simple modifications of the digitizer of FIG. 2 would allow negative or bipolar voltage ranges. For any voltage range, the most positive (least negative) voltage would be applied to the top of the voltage divider 23 and the most negative (least positive) voltage would be applied to the bottom of voltage divider 23. The most negative (least positive) voltage would also be applied to the bottom of the storage capacitors of the storage element 17 (FIG. 3). Thus, the positive range used in the example is a subset of the more general voltage range which can be used. The stored voltage always droops toward the negative extreme of the voltage range, and refresh always pulls it up to the next more positive reference level.

Any number of desired levels of the n-ary analog approximation signal can be generated by selecting the desired number of stages of the digitizer 13. It is not necessary to provide a full range of n-ary levels between 0 and the maximum value of a applied signal when it is known that the analog signal will always be within a certain range, by adjusting the value of the lowest resistor in the voltage divider 23. This reduces the number of stages required to achieve a desired resolution of the n-ary signal. It is also not necessary that the n levels be evenly spaced if lesser accuracy can be tolerated in part of the range of the analog signal, although the stored signal must be refreshed at a rate which assures that it remains within the narrowest window.

FIG. 3 discloses the exemplary embodiment of the analog storage element 17 which comprises series-connected master and slave sample and hold circuits 37 and 39. The sample and hold circuits 37 and 39 comprise integrated circuits 41 and 43 respectively, which in the example are Datel SHM-IC-1 integrated circuits, and storage capacitors 45 and 47.

The sample and hold circuits 37 and 39 are controlled by clock signals S*/H1 and S*/H2 applied to the control leads 19' and 19" respectively. The sample and hold circuits are in their sample state when the control signals are low and in the hold mode when these signals are high.

The n-ary analog approximation signal generated on the lead 15 by the n-ary digitizer is applied to the input of the master sample and hold circuit 37 and copied by the slave sample and hold circuit 39.

Figure 4:
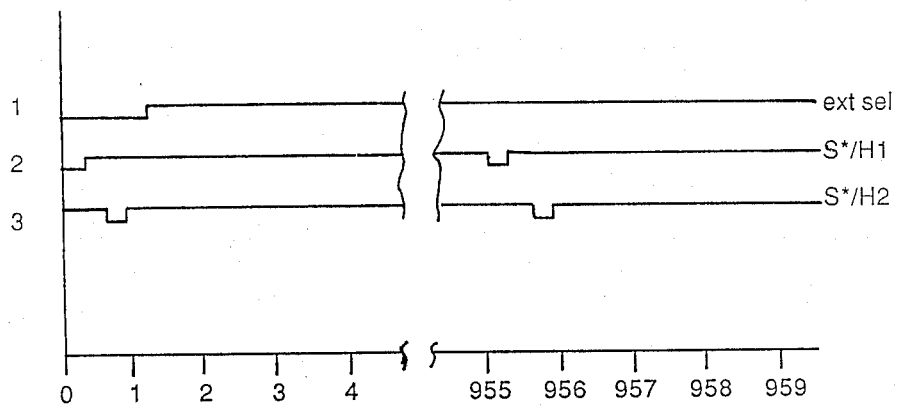
FIG. 4 is a timing diagram which illustrates the relations between signals used to control the n-ary analog memory device of FIGS. 1-3.

FIG. 4 illustrates a typical timing diagram for the n-ary memory illustrated in FIGS. 1 through 3. As can be seen in the example, the external select signal applied to the switch 3 goes low to activate the switch 3 to apply the external input to the tracking n-ary digitizer 13. The n-ary approximation of the applied analog signal generated by the digitizer 13 is sampled by the master sample and hold circuit 37 when the control signal S*/H1 goes low. After the signal has been stored in the master sample and hold circuit 37 and the signal S*/H1 goes high, the control signal S*/H2 goes low and the slave sample and hold circuit 39 copies the analog approximation signal from the master sample and hold circuit 41. After the external signal has been entered into the master sample and hold circuit 41, the external select signal goes high so that the switch 3 switches to the internal signal on the lead 7. This applies the analog approximation signal in the slave sample and hold circuit 43 to the tracking n-ary digitizer 13. However, since the master sample and hold circuit 37 is in the hold mode, the stored signals are not affected.

The sample and hold circuits 37 and 39 include output amplifiers with very high input impedance so that even though the output of the master sample and hold circuit is read by the slave and the output of the slave sample and hold circuit may be read by an external circuit, and the digitizer when switch 3 is appropriately positioned, there is no appreciable effect on the stored signals. However, the charges on the capacitors 45 and 47 will leak so that the stored voltages will droop with time. The drooping voltage generated by the slave sample and hold circuit 39 is continuously applied to the n-ary digitizer 13 which boosts it to the next higher n-ary level. Periodically, at intervals shorter in duration than the time required for the voltage on the slave sample and hold circuit to decay below the reference voltage defining the lower limit of the window bracketing the original analog signal, the control signal S*/H1 goes low so that the voltage on the capacitor 45 of the sample and hold circuit 37 is refreshed to the voltage defining the top of the window. Subsequently the control signal S*/H2 for the slave sample and hold circuit 39 goes low to refresh the slave sample and hold circuit. The master and slave sample and hold circuit 37 and 39 are provided to prevent latching of the memory device due to the positive feedback which would occur with only one sample and hold circuit.

Any scheme can be used for generating a two-phase control signal which sequentially triggers the master and slave sample and hold circuits 37 and 39. For instance, in addition to the separate signals illustrated in connection with FIGS. 3 and 4, a single clock pulse can be applied to both sample and hold circuits with the master sample and hold circuit sampling on the leading edge of the pulse and the slave circuit sampling on the trailing edge (subsidiary pulses would have to be triggered on leading and trailing edges of the external pulse, using internal circuitry).

Figure 5:
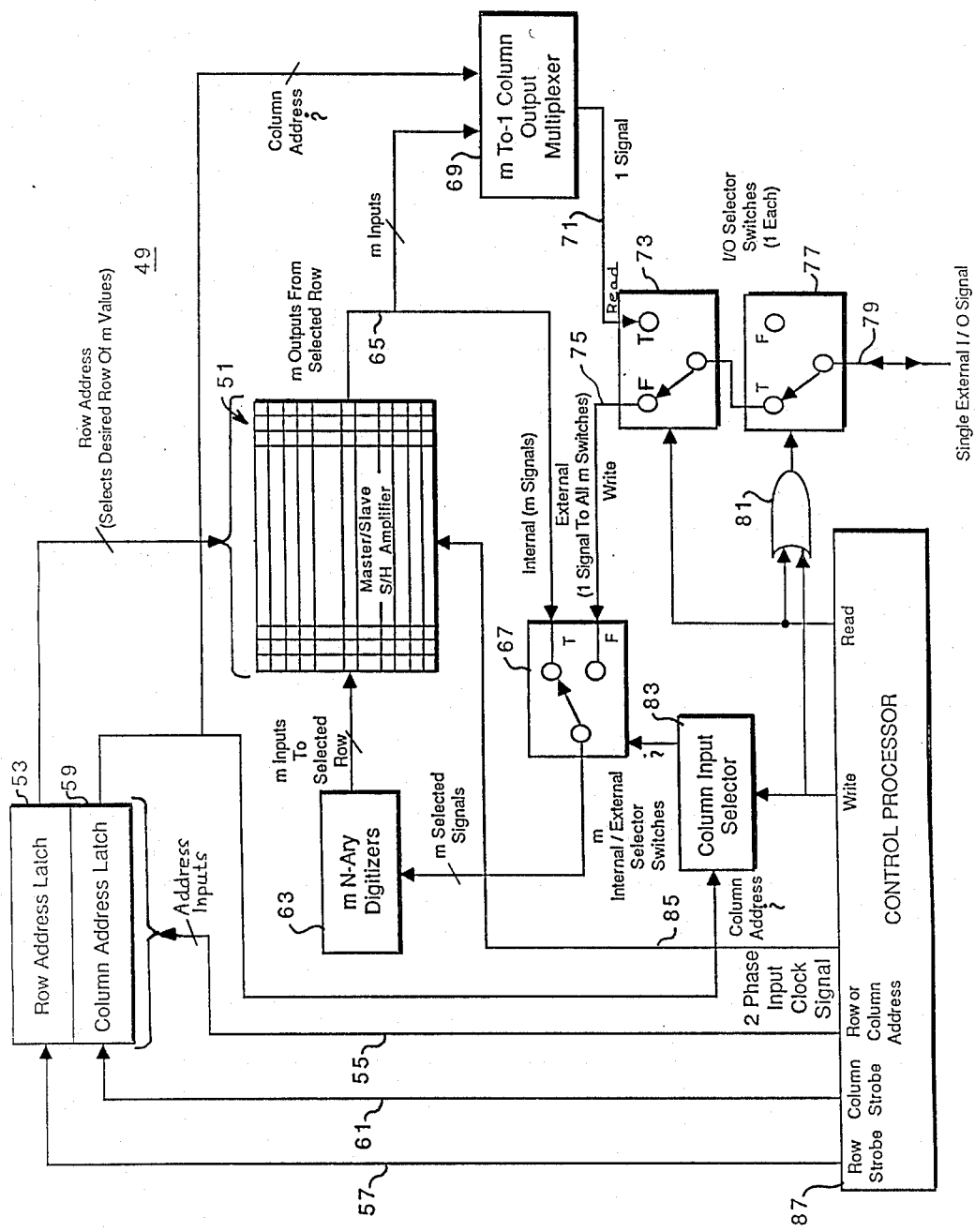
FIG. 5 is a block illustrating the use of a plurality of n-ary analog memories in a dynamic RAM.

The n-ary memory of the invention has many uses, one of which is in an analog dynamic RAM. An exemplary embodiment of such a device is shown in FIG. 5. This analog dynamic RAM 49 includes an array 51 of m rows and m columns of analog memory devices 17 such as the master/slave sample and hold memory devices discussed in connection with FIGS. 1 and 4. A row address latch 53 selects any one of the m rows of the array 51 in response to an address on a row/column address bus 55 and a row strobe on lead 57. A column address latch 59 selects any one of the m columns in response to an address on the bus 55 and a column strobe on lead 61.

A set 63 of m tracking n-ary digitizers, such as the digitizers 13 described in connection with FIG. 2, is connected to a row in the array 51 selected by the row address latch 53 to provide simultaneous inputs to each column location in the selected row. The m outputs from the selected row are each applied by m leads 65 to one of m internal/external selector switches 67, and to an m-to-1 column output multiplexer 69. The m-to-1 column output multiplexer 69 also receives the column address from the column address latch 59. The signal stored in the selected column location in the selected row is switched by the m-to-1 column output multiplexer 69 onto a common output lead 71 connected to a single read/write selector switch 73.

Read/write selector switch 73 is a two position switch which selects the output lead 71 in response to an applied READ signal and otherwise selects external input lead 75. The switch 73 is in series with another two position input/output switch 77 which connects the switch 73 to a common input/output bus 79 in response to either a READ or WRITE signal received from an OR gate 81, and otherwise disconnects the switch 73 from the bus 79.

The common input lead 75 is connected to each of the m internal/external selector switches 67. The two position switches 67 each connect either the feedback signal on one of the m leads 65 or the external signal on the common input lead 75 to one of the set 63 of n-ary digitizers. In response to a WRITE signal, a column input selector 83 operates only the selector switch 67 associated with the column identified by the column address stored in the column address latch 59 to the false condition connecting the input lead 75 (and hence the external repeat signal) to the associated n-ary digitizer. The remaining selector switches 67 all apply the signal stored in the associated column of the selected row in the array 51 to the associated digitizer. In the absence of a WRITE signal, each of the switches 67 connects the associated lead 65 to the appropriate digitizer in the set 63 of digitizers.

The n-ary signals generated by the set 63 of m digitizers are stored in the selected row of the array 51 in response to an input clock signal both of which is a twophase control signal generated on a pair of leads indicated at 85. The two-phase clock signal is generated when a new external value of an analog signal is to be stored, and also periodically to refresh the stored analog approximation signals. Refresh of the addressed row occurs without read or write I/O whenever the twophase clock occurs with both READ and WRITE false. These control signals, as well as the ROW STROBE, COLUMN STROBE, ROW/COLUMN ADDRESS, READ and WRITE signals are all generated by a control processor 87, for example a microprocessor.

The dynamic RAM 49 of FIG. 5 can store approximations of $m^2$ analog signals indefinitely. All the signals stored in a row are refreshed simultaneously. The output of each column of the selected row is applied to one of the set 63 of m n-ary digitizers which boosts it to the top of its voltage window. The two-phase clock signal generated periodically by the control processor 87 then writes the refresh values into the master and slave sample and hold circuits for the row. The procedure is repeated row by row cycling through all rows frequently enough to prevent excessive droop of stored values.

If a new value of an analog signal on the input/output bus 79 is to be written into a memory location in the dynamic RAM 49, the control processor 87 generates a WRITE signal. The WRITE signal operates the input/output switch 77 to connect the bus 79 to the common input lead 75 through the READ/WRITE switch 73. The control processor 87 also generates row and column addresses identifying the location in the array 51 where the new analog signal value is to be stored. These addresses are successively transmitted over the bus 55 and latched into the row and column address latches 53 and 59 by strobes on the leads 57 and 61 respectively. The column input selector 63, in response to the WRITE signal and the column address, connects the common input lead 75 only to the digitizer 63 associated with the selected column in which the analog signal is to be stored. The new analog signal is converted to an n-ary signal by the associated digitizer and applied to the selected row of the array 51 designated by the row address latch 53. The new analog approximation signal is stored in the array in response to the two-phase input strobe generated by the control processor 87. Since each of the other digitizers of the set 65 remains connected through its associated internal/external selector switch 67 to a column output of the selected memory row, the signals stored in the remaining locations in the selected row will be refreshed in response to the input strobe.

When a stored analog approximation signal is to be read from the array 51, all of the storage signals on the selected row are fed to the m-to-1 column output multiplexer 69 which applies the signal from the selected column to the common output lead 71. The control processor 87 generates a READ signal which operates the switches 73 and 75 to pass the selected analog approximation signal on output lead 71 to the input/output bus 79. All of the stored signals on the selected row including the signal being read, remain connected to one of the digitizers in the set 63 through the associated internal/external selector switch 67, such that when the clock pulses are generated, the stored signals are refreshed.

Figure 6:
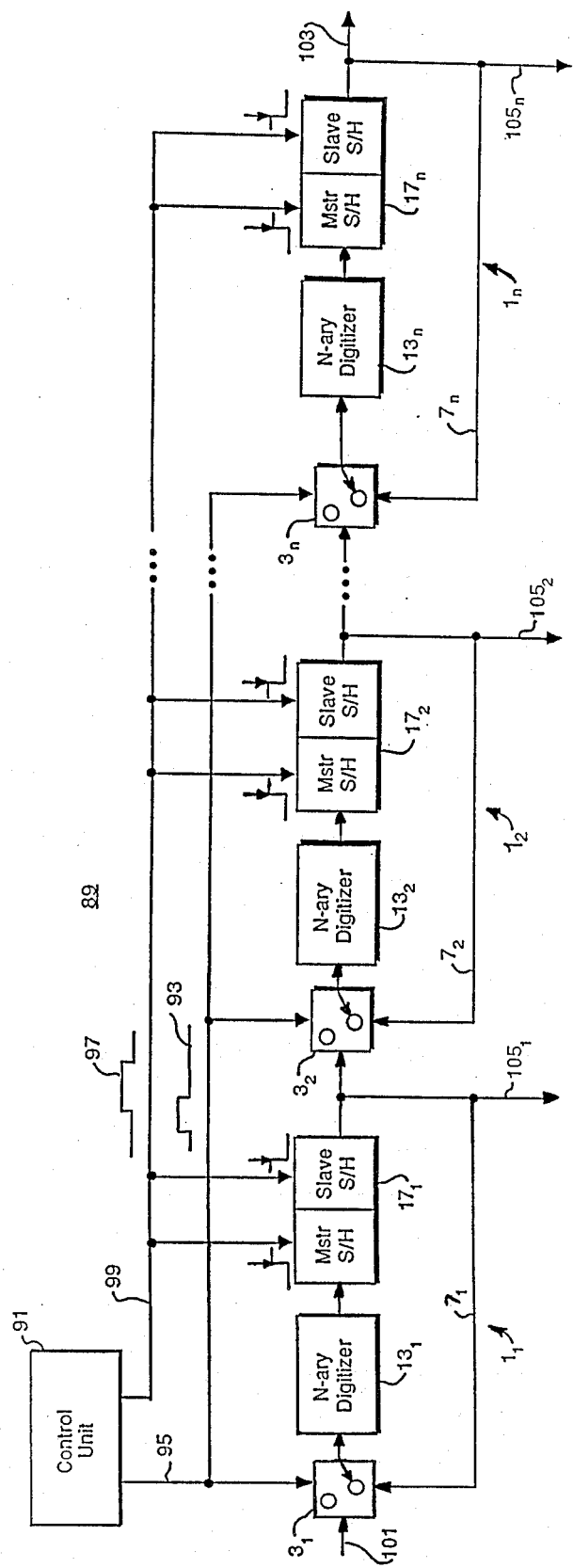
FIG. 6 is a block diagram of a shift register employing the n-ary analog memory devices of the invention.

Another use of the invention is in a shift register for storing analog signals. An exemplary embodiment of such a device is illustrated in FIG. 6. This shift register 89 includes a state analog memory device 1 for each of the n stages of the register. The state analog memory devices $1_1, 1_2 \ldots 1_n$ p are connected in series to form successive units or stages through which the analog signals are successively passed under control of the common control unit 91.

When the signals stored in the shift register 89 are to be shifted, the control unit 91 generates a select signal 93 on lead 95. The select signal 93 operates all of the switches 3 to apply the analog approximation signal stored in the slave sample and hold circuit of the analog storage element 17 in each stage to the n-ary digitizer 13 of the next successive stage. The n-ary digitizers 13 boost the analog approximation signals up to the top of the respective voltage windows. The control unit 91 then generates on lead 99 a two-phase control signal 97 which is applied to the master and slave sample and hold circuits of each of the analog storage elements 17. The master sample and hold circuits are responsive to the leading edge of the control signal pulse 97 to sample and hold the boosted analog approximation signal stored in the slave sample and hold circuit of the preceding stage. The slave sample and hold circuits then copy the new signal stored in the master sample and hold circuit in response to the trailing edge of the control signal pulse 97. It is understood that the master and slave sample and hold circuits contain the internal circuitry discussed above to respond to the leading and trailing edges of the control signal pulse 97 respectively. As shown graphically on FIG. 6 the leading edge of the control signal pulse 97 occurs during the select pulse 93 while the trailing edge of the control signal pulse occurs after the select pulse to provide proper progression of the signals through the shift register.

As can be appreciated, each time the stored analog signals are shifted by the shift register of FIG. 6 they are boosted back up to their original n-ary level. If shifts are not called for frequently enough to prevent the stored analog approximation signals from drooping out of their voltage windows, the control unit 91 periodically generates the control pulses 97 to refresh the stored signals through feedback loops formed by the leads 7. New signals to be stored in the shift register 89 are applied serially on the input lead 101. A serial output is provided on the lead 103 by the slave sample and hold circuit of the last analog storage element $17_n$ in the series. A parallel output is provided on the leads 105 connected to the slave sample and hold circuits of each of the analog storage elements 17.

Figure 7:
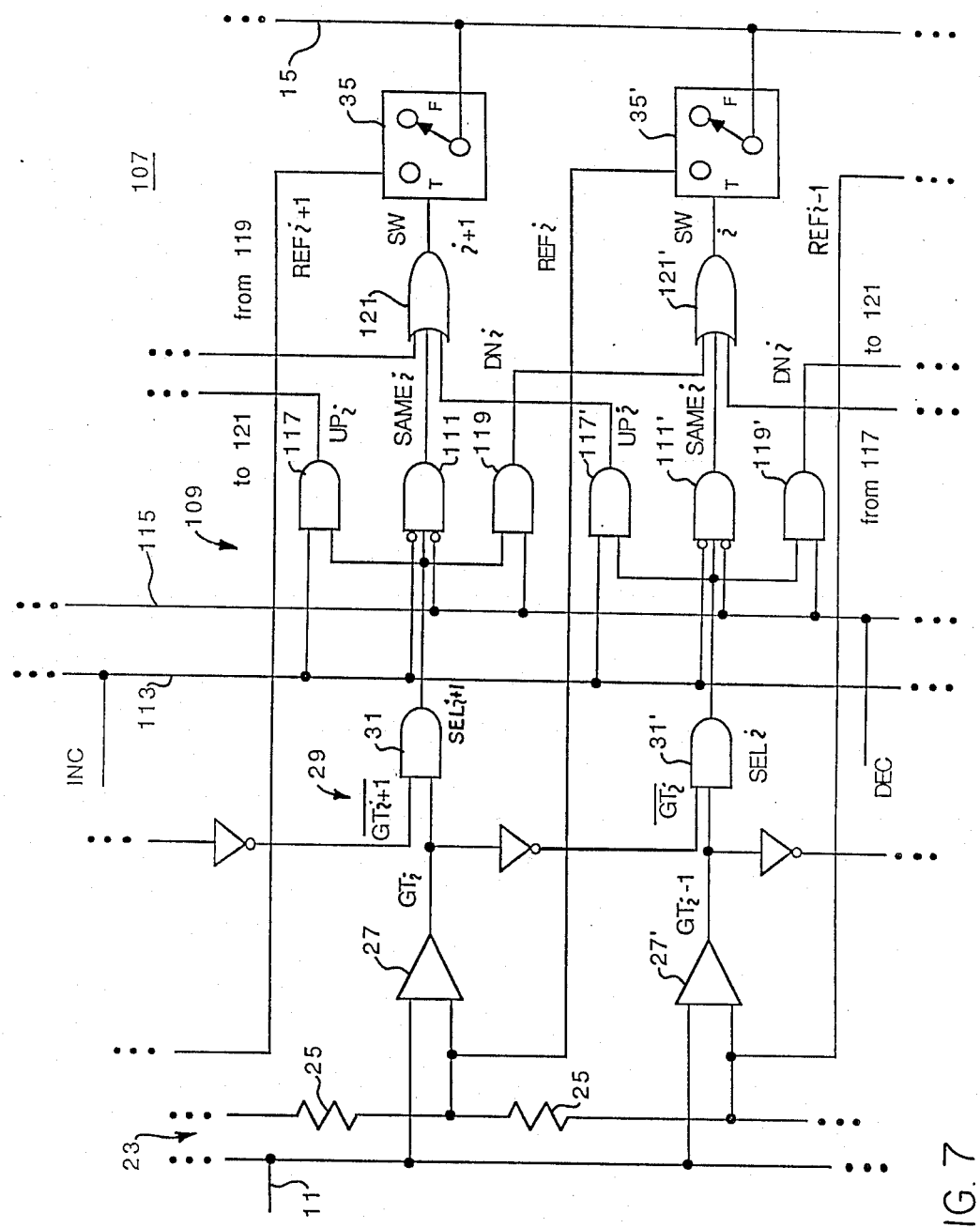
FIG. 7 is a schematic diagram of another embodiment of the tracking n-ary digitizer of FIG. 2 modified to selectively increment or decrement a stored analog signal.

FIG. 7 illustrates a modification of the n-ary digitizer 13 shown in FIG. 2 for applications wherein it is desired to have the capability of incrementing or decrementing the stored analog signal. Such a modified n-ary digitizer 107 has application, for instance in a neural network such as that disclosed in our copending application referenced above.

As can be seen from FIG. 7, additional logic circuitry 109 is interposed between the logic circuit 29 in the embodiment of FIG. 2 and the switches 35 which select the reference voltage applied to the output lead 15. The additional logic circuitry 109 includes, for each n-ary level of the digitizer 107, an AND gate 111 to which is applied the output of the associated AND gate 31 which in the embodiment of FIG. 2 directly controlled the associated switch 35. Also applied to each AND gate 111 are inverted inputs from leads 113 and 115 carrying a digital increment signal INC and a digital decrement signal DEC respectively.

The output from each AND gate 31 is also applied, together with the INC signal, to an AND gate 117, and with the DEC signal, to an AND gate 119. The output from each AND gate 111 is applied, together with the output of AND gate 119 associated with the n-ary level of next greater magnitude, and the output of AND gate 117 associated with the n-ary level of next lower magnitude, to an OR gate 121 which in turn controls the associated switch 35.

Operation of the modified tracking n-ary digitizer 107 of FIG. 7 can be fully appreciated from the following example. With the analog signal applied on lead 11 greater in magnitude than the ith n-ary level generated by voltage divider 23, but smaller in magnitude than the i+1 level, the output SELi+1 of AND gate 31 will be high as can be understood from the discussion in connection with the circuit of FIG. 2. If the INC and DEC signals are both low, the output SAME i of AND gate 111 will be high so that OR gate 121 will turn on switch 35 and apply REFi +1 to output lead 15.

If the DEC signal is high, indicating that the signal to be stored should be decremented one n-ary level, the output of AND gate 111 will be low as will the output of AND gate 111'. However, the output of AND gate 119 will be high so that OR gate 121' will turn on switch 35' to apply REFi rather than REFi+1 to output lead 15. Thus, the stored signal will be one n-ary level smaller in magnitude than that which would have been stored without the DEC signal.

Assume now that the signal applied on lead 11 is greater in magnitude than the i−1 n-ary level of the digitizer 107, but smaller in magnitude than the ith level. In the absence of an INC or DEC signal, the REFi signal would be applied to the output lead 15 by the turning on of switch 35' as will be evident from the above discussion. However, if the INC signal is high, the output of AND gate 111' will be low so that switch 35' will be turned off. On the other hand, the output of AND gate 117' will be high to turn on switch 35 through OR gate 121 and apply REFi+1 to the output lead 15.

It should be evident from the above that the invention can be used to store analog voltages for any length of time. Thousands of these state analog memory devices can be integrated onto a single chip with appropriate refresh logic and memory addressing, so that thousands of analog values can be stored and retrieved at will. That should be of great utility in wave form generators, wave form analysis, pattern recognition, and in neural nets, to name just a few possible applications.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed:

1. Apparatus for storing an approximation of an analog signal for a prolonged period of time comprising:
    a tracking n-ary digitizer which converts an applied signal into an n-ary signal having one of n discrete levels where n is at last three, with said one level being the level next greater in magnitude than the level of the applied signal;
    an analog storage element which selectively in response to control signals stores as an analog approximation signal, the n-ary signal generated by said tracking n-ary digitizer, said stored analog approximation signal drooping with time;
    switching means which selectively in response to a first value of a select signal applies said analog signal to said tracking n-ary digitizer as said applied signal, and in response to a second value of said select signal applies said stored analog approximation signal stored in said analog storage element to said tracking n-ary digitizer as said applied signal; and
    control means which generates said select signal with said first value when a new value of said analog signal is to be stored and with said second value otherwise, and which generates said control signals when said selected signal has said first value, and periodically at intervals which are shorter in duration than the time required for said stored analog approximation signal in said analog storage element to droop to the value of the n level next smaller in magnitude than said one level.

2. The apparatus of claim 1 wherein said analog storage element comprises sample and hold means which samples the n-ary signal generated by said tracking n-ary digitizer in response to said control signal from the control means and which continuously generates an output voltage representative of the stored analog approximation signal.

3. The apparatus of claim 2 wherein said sample and hold means comprises master and slave sample and hold circuits connected in series, with the master sample and hold circuit connected to receive the n-ary signal generated by said tracking n-ary digitizer, and with the slave sample and hold circuit continuously generating an output voltage representative of the stored analog approximation signal, and wherein said control means generates a two phase control signal with said master sample and hold circuit responsive to the first phase of said control signal to sample and store said n-ary signal generated by said tracking n-ary digitizer and said slave sample and hold circuit being responsive to the second phase of said control signal to sample and store the signal stored in said master sample and hold circuit.

4. The apparatus of claim 3 arranged to form a shift register for storing a plurality of analog signals for a prolonged period of time, comprising a plurality of units each comprising a tracking n-ary digitizer, an analog storage element comprising master and slave sample and hold circuits, and switching means, said units being connected in series with the output of the slave sample and hold circuit of all but the last unit connected to the switching means of the next successive unit as the analog signal, said apparatus including a common control means which applies a common select signal of said first value to each switching means to shift the analog approximation signal stored in each unit except the last unit to the next successive unit and which generates common control signals for each of said units, the output of said last unit forming a serial output of the shift register and the outputs of the slave sample and hold circuits of all the units forming a parallel output.

5. The apparatus of claim 1 wherein said tracking n-ary digitizer comprises:
means generating n reference voltages;
means comparing the applied signal with each of said reference voltages, and
logic means responsive to the comparing means selecting as said one level of said n-ary signal the reference voltage next greater in magnitude than the reference voltage of-greatest magnitude which is exceeded in magnitude by the applied signal.

6. The apparatus of claim 5 including means to selectively modify the n-ary signal from said one level.

7. The apparatus of claim 5 wherein said logic means also includes means responsive to an increment signal selecting as said one n-ary level signal the reference voltage which is second greater in magnitude than the reference voltage of greatest magnitude which is exceeded in magnitude by the applied signal.

8. The apparatus of claim 7 wherein said logic means further includes means responsive to a decrement signal selecting as said one n-ary level signal the reference voltage of greatest magnitude which is exceeded in magnitude by the applied signal.

9. The apparatus of claim 5 wherein said logic means also includes means responsive to a decrement signal selecting as said one n-ary level signal the reference voltage of greatest magnitude which is exceeded in magnitude by the applied signal.

10. The apparatus of claim 5 wherein said analog storage element comprises a master sample and hold circuit connected to said tracking n-ary digitizer and a slave sample and hold circuit connected to the master sample and hold circuit, and wherein said control means generates a two phase control signal with said master sample and hold circuit responsive to the first phase of said control signal to sample and store said n-ary signal generated by said tracking n-ary digitizer and said slave sample and hold circuit being responsive to the second phase of said control signal to sample and store the signal stored in said master sample and hold circuit.

11. The apparatus of claim 1 arranged to form a dynamic RAM for storing a plurality of analog signals for a prolonged period of time comprising:

an array of said analog storage elements arranged in rows and columns;
a tracking n-ary digitizer connected to each column of analog storage elements;
a common input lead;
switching means connected to the input of each digitizer selectively connecting the individual digitizer to said common input lead and to the output of the associated column of analog storage elements,
a common output lead, and
a common output multiplexer connecting, in response to a column address signal, the output of a selected one of said analog storage elements to the common output lead,
said control means generating in addition to said select and control signals, a row address signal selecting a specific row for input and output and otherwise repetitively selecting successive rows, and a column address signal selecting a specific column for input and output, said array being responsive to said row address signal to connect said tracking n-ary digitizers for each column, and to apply said control signals, to the analog storage elements in the selected row, and said switching means being responsive to said column address signal to apply said select signal of a first value only to the switching means associated with the column in which a new analog signal is to be stored.

12. The apparatus of claim 11 including a common input/output bus and input/output switch means selectively connecting said common input/output bus to said common input lead in response to a write signal and to the common output lead in response to a read signal, and wherein said control means selectively generates said read and write signals.

13. A method of storing an approximation of an analog signal for a prolonged period of time comprising the steps of:
converting the analog signal to an n-ary signal having one of n discrete levels, where n is at least three, with said one level being the level next greater in magnitude than the level of said analog signal,
storing said n-ary signal in an analog storage device as a stored analog approximation signal which droops with time,
continuously making said stored analog approximation signal available as an output signal, and
periodically, at intervals of time shorter in duration than the time required for the stored analog approximation signal to droop to the level of the level next smaller in magnitude than said one level, refreshing the level of said stored analog approximation signal back up to said one level.

14. The method of claim 13 wherein said step of refreshing the level of the stored analog approximation signal comprises:
converting the stored analog approximation signal to an n-ary signal having said one level, and
storing said n-ary signal in the analog storage device as a refreshed stored analog approximation signal.

15. The method of claim 14 wherein said steps of converting the analog signal and the stored analog approximation signal to an n-ary signal comprise:
generating n reference voltages representative of said n levels,
comparing the analog signal and the stored analog approximation signal to each of said reference voltages;

selecting as said n-ary signal, the reference voltage next greater in magnitude than the reference voltage of greatest magnitude which is exceeded in magnitude by the analog signal or stored analog approximation signal.

16. The method of claim 14 wherein said step of storing said n-ary signal comprises sampling the n-ary signal and storing the sample in a master sample and hold circuit and subsequently sampling the signal stored in the master sample and hold circuit and storing that sample in a slave sample and hold circuit as said stored analog approximation signal.

17. The method of claim 16 adapted for serially storing successive values of an analog signal comprising: shifting the stored analog approximation signal in stages to successive analog storage elements comprising master and slave sample and hold circuits by converting the output signal of the preceding stage to an n-ary signal of next greater magnitude, storing said n-ary signal in the master sample and hold circuit of the succeeding stage and then copying he contents of each master sample and hold circuit into the associated slave sample and hold circuit, and periodically refreshing the stored analog approximation signal stored in each stage.

18. The method of claim 13 adapted for storing a plurality of analog signals for a prolonged period of time comprising; converting the plurality of analog signals into a plurality of n-ary analog approximation signals, storing the plurality of n-ary analog approximation signals in an array having rows and columns, accessing said stored analog approximation signals by row and column for reading and writing values of said analog approximation signals, successively for each row simultaneously refreshing all of the stored analog approximation signals in the row by simultaneously converting each of the stored analog approximation signals to a new n-ary signal next greater in magnitude and storing said new n-ary signals;

19. The method of claim 18 wherein a new value for a selected stored analog approximation signal is written into the array by accessing the selected signal by row and column converting the new value to an n-ary signal having said one level and storing the new analog approximation signal in the array at the selected row and column and simultaneously refreshing the other stored analog approximation signals in the selected row by simultaneously converting each of the other stored signals in the row to a new n-ary signal of next greater magnitude and storing the new n-ary signal at the associated location in the array.

20. The method of claim 13 including selectively modifying the n-ary signal from said one level.

21. The method of claim 13 wherein said step of converting said analog signal to an n-ary signal includes generating in response to an increment signal an n-ary signal having a n level which is the second level greater in magnitude than the analog signal.

22. The method of claim 13 wherein said step of converting said analog signal to an n-ary signal includes generating in response to a decrement signal an n-ary signal having a n level which is the level of greatest magnitude which is exceeded by the magnitude of the analog signal.

* * * * *

UNITED STATES PATENT AND TRADEMARK OFFICE
CERTIFICATE OF CORRECTION

PATENT NO. : 4,809,223

DATED : February 28, 1989

INVENTOR(S) : PAUL B. BROWN

It is certified that error appears in the above-identified patent and that said Letters Patent is hereby corrected as shown below:

In the Abstract, line 4, "a discrete levels" should be --n discrete levels--.

Col. 4, line 59, the period after "SEL15" should be deleted.

Col. 7, line 32, "twophase" should be --two-phase--.

Col. 8, line 34, "p" should be deleted.

Claim 5, col. 11, line 34, "of-greatest" should be --of greatest--.

Claim 17, col. 13, line 21, "he" should be --the--.

Claim 22, col. 14, line 29, "n" should be deleted.

Signed and Sealed this

Twelfth Day of December, 1989

*Attest:*

JEFFREY M. SAMUELS

*Attesting Officer*   *Acting Commissioner of Patents and Trademarks*